(12) United States Patent
Kaneko

(10) Patent No.: US 10,312,257 B2
(45) Date of Patent: Jun. 4, 2019

(54) SEMICONDUCTOR DEVICE AND METHOD FOR MANUFACTURING THE SAME

(71) Applicant: Toshiba Memory Corporation, Tokyo (JP)

(72) Inventor: Akio Kaneko, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/908,921

(22) Filed: Mar. 1, 2018

(65) Prior Publication Data

US 2018/0190669 A1  Jul. 5, 2018

Related U.S. Application Data

(62) Division of application No. 15/422,313, filed on Feb. 1, 2017, now Pat. No. 9,929,178.

(30) Foreign Application Priority Data

Sep. 9, 2016 (JP) .................................. 2016-176672

(51) Int. Cl.
*H01L 27/11582* (2017.01)
*H01L 21/02* (2006.01)
(Continued)

(52) U.S. Cl.
CPC .. *H01L 27/11582* (2013.01); *H01L 21/02667* (2013.01); *H01L 21/225* (2013.01);
(Continued)

(58) Field of Classification Search
CPC ......... H01L 27/11582; H01L 21/28273; H01L 21/28282; H01L 27/11556;
(Continued)

(56) References Cited

U.S. PATENT DOCUMENTS

| 8,187,936 B2 | 5/2012 | Alsmeier et al. |
| 9,070,589 B2 | 6/2015 | Kawai et al. |

(Continued)

FOREIGN PATENT DOCUMENTS

| JP | 2013-534058 | 8/2013 |
| JP | 2014-175348 | 9/2014 |
| JP | 2014-179465 | 9/2014 |

*Primary Examiner* — David Vu
(74) *Attorney, Agent, or Firm* — Kim & Stewart LLP

(57) ABSTRACT

A method for manufacturing a semiconductor device includes forming a first semiconductor layer, forming a stacked body including alternately formed first and second layers on the first semiconductor layer, forming a hole from an upper surface of the stacked body to the first semiconductor layer to expose the first semiconductor layer therein. A first insulating layer is formed on the inner wall of the hole, and a second semiconductor layer is formed on the first insulating layer within the hole, wherein the second semiconductor layer is electrically connected to the first semiconductor layer. A metal layer is provided in contact with at least one of the first and second semiconductor layers. The stacked body, semiconductor layers, insulating layer and metal layer are exposed to an annealing temperature sufficient to cause migration of metal in the metal layer into one of the first and second semiconductor layers.

20 Claims, 7 Drawing Sheets

(51) Int. Cl.
*H01L 21/225* (2006.01)
*H01L 21/28* (2006.01)
*H01L 21/311* (2006.01)
*H01L 21/3205* (2006.01)
*H01L 21/3213* (2006.01)
*H01L 21/324* (2006.01)
*H01L 27/11556* (2017.01)

(52) U.S. Cl.
CPC .. H01L 21/28273 (2013.01); H01L 21/31111 (2013.01); H01L 21/324 (2013.01); H01L 21/32051 (2013.01); H01L 21/32133 (2013.01); H01L 27/11556 (2013.01); *H01L 21/28282* (2013.01)

(58) Field of Classification Search
CPC ......... H01L 21/32051; H01L 21/32133; H01L 21/31111; H01L 21/225; H01L 21/324; H01L 21/02667
See application file for complete search history.

(56) References Cited

U.S. PATENT DOCUMENTS 9,123,749 B2  9/2015 Kawai et al.
9,478,495 B1  10/2016 Pachamuthu et al.

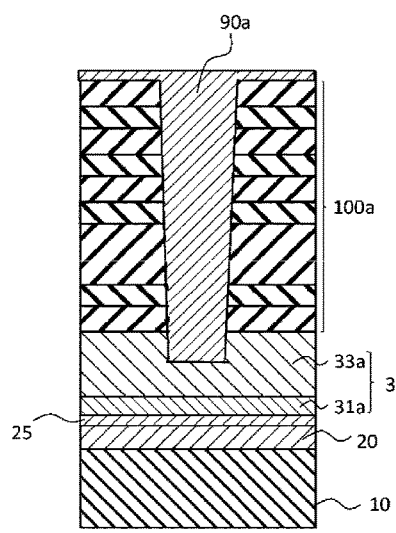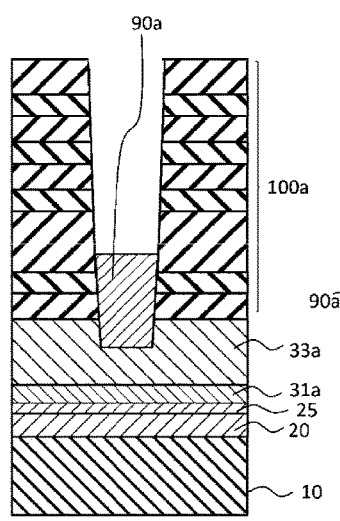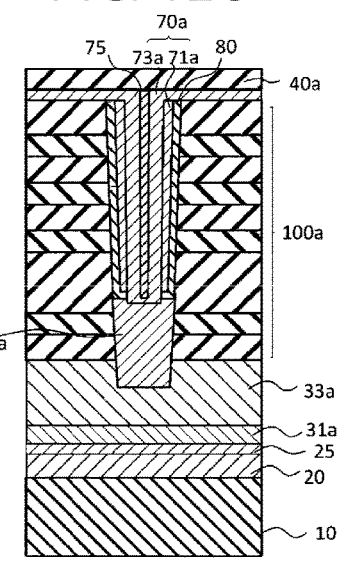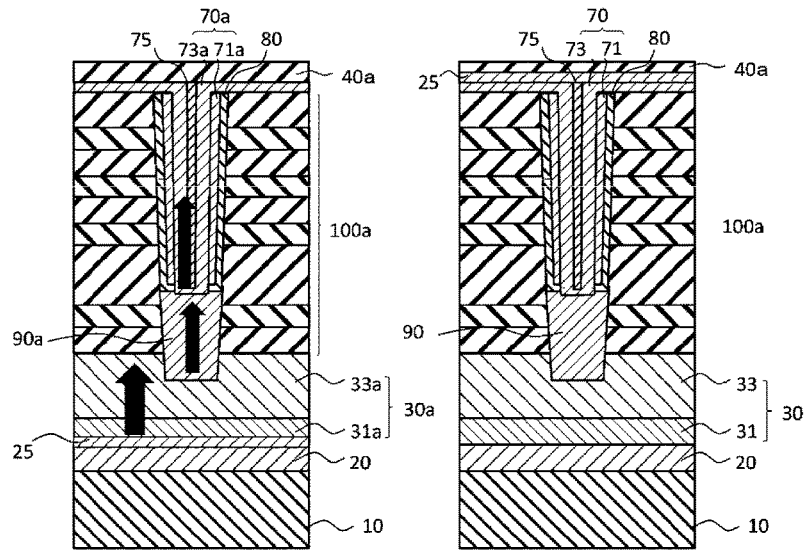

SEMICONDUCTOR DEVICE AND METHOD FOR MANUFACTURING THE SAME

CROSS-REFERENCE TO RELATED APPLICATIONS

This application is a division of U.S. patent application Ser. No. 15/422,313, filed on Feb. 1, 2017, which is based upon and claims the benefit of priority from Japanese Patent Application No. 2016-176672, filed on Sep. 9, 2016, the entire contents of each of which are incorporated herein by reference.

FIELD

Embodiments described herein relate generally to a semiconductor device and a method for manufacturing the same.

BACKGROUND

There is known a technique to form a three-dimensional memory cell array by extending a hole inwardly of a stacked body of electrode layers, each of which functions as a control gate in a memory device, spaced apart by insulating layers provided between the electrode layers, forming a charge storage layer on an inner wall of the hole, and then providing silicon within the hole.

DESCRIPTION OF THE DRAWINGS

FIGS. 12A, 12B, and 12C are diagrams illustrating a step in the method for manufacturing the semiconductor device according to the second embodiment.

FIGS. 13A and 13B are diagrams illustrating a further step of the method for manufacturing the semiconductor device according to the second embodiment.

DETAILED DESCRIPTION

Figure 1:
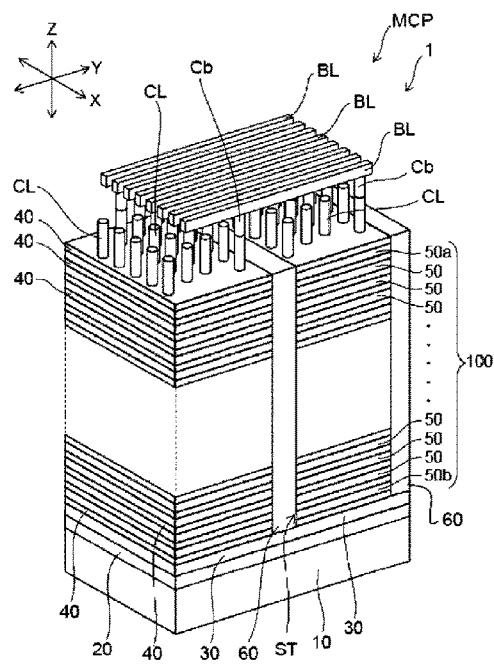
FIG. 1 is a diagram illustrating a memory cell portion of a semiconductor device according to first and second embodiments hereof.

According to one embodiment, there is provided a semiconductor device having a channel region more efficiently crystallized and a method for manufacturing the same.

In general, according to one embodiment, a method for manufacturing a semiconductor device includes forming a first semiconductor layer on a first underlying layer, forming a stacked body including alternately formed first layers and second layers on the first semiconductor layer, forming a hole, having an inner wall and a base, from an upper surface of the stacked body to the first semiconductor layer to expose the first semiconductor layer therein. A first insulating layer is formed on the inner wall of the hole, and a second semiconductor layer is formed on the first insulating layer within the hole, wherein the second semiconductor layer is electrically connected to the first semiconductor layer. A metal layer is provided in contact with at least one of the first semiconductor layer and the second semiconductor layer. The stacked body, first and second semiconductor layers, insulating layer and metal layer are exposed to an annealing temperature sufficient to cause migration of metal in the metal layer into one of the first and second semiconductor layers.

Hereinafter, embodiments for implementing the disclosure will be described.

(First Embodiment)

A semiconductor device according to a first embodiment is described with reference to FIG. 1 to FIGS. 10A and 10B.

Furthermore, in the following illustrations of the drawings, the same portions of the device shown in different drawing figures are denoted by the same reference numerals or characters. Additionally, the drawings are schematic, in which, for example, the relationships and ratios between the thickness and the planar size of features may be different from those of an actual device.

The semiconductor device according to the present embodiment is, for example, a NAND-type non-volatile memory device, and includes a memory cell portion MCP including three-dimensionally arranged memory cells. FIG. 1 is a perspective view illustrating a memory cell portion MCP of the semiconductor device 1. Furthermore, in FIG. 1, an insulating layer that is provided between bit lines BL and a stacked body 100 in an actual device is omitted from the figure.

In the present specification, for ease of explanation, an XYZ Cartesian coordinate system is used. In this coordinate system, two directions that are parallel to the principal surface of an insulating layer 10 and are orthogonal to each other are referred to as an X-direction and a Y-direction, and a direction that is orthogonal to both the X-direction and the Y-direction is referred to as a Z-direction. A plurality of electrode layers 50 are stacked in the Z-direction and extend in the X-direction.

Figure 2A:
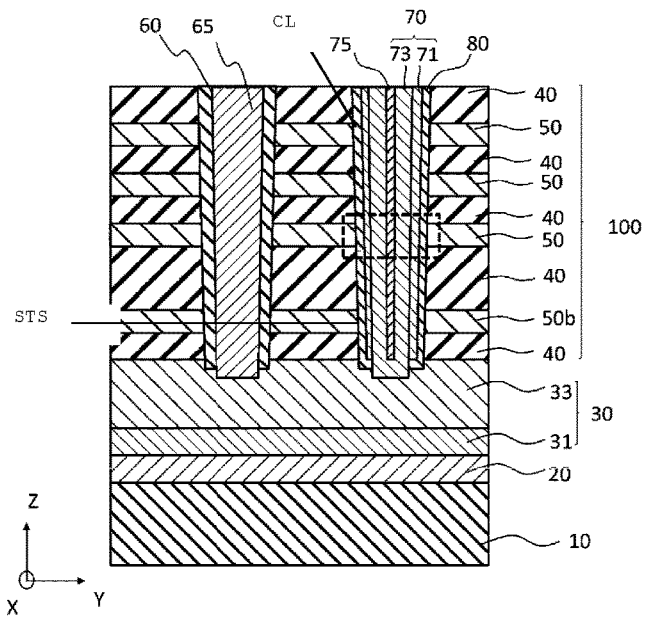
FIGS. 2A and 2B are cross-sectional views illustrating the memory cell portion of the semiconductor device according to the first embodiment.
Figure 2B:
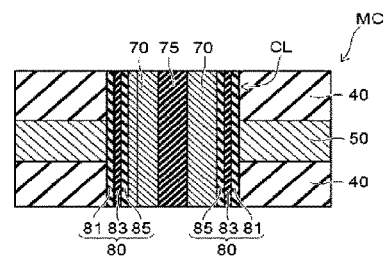

The memory cell portion MCP illustrated in FIG. 1 includes, on a substrate (not illustrated), an insulating layer 10, stacked bodies 100, which are located over a source line 20 and a source layer 30, and columnar portions CL, which penetrate through the stacked bodies 100 in the Z-direction as shown in FIGS. 2A and 2B. The stacked bodies 100 include a plurality of electrode layers 50 stacked in the Z-direction, with an insulating layer 40 provided between each adjacent electrode layer 50 in the Z-direction. Each electrode layer 50 serves as a control gate for a memory cell, i.e., as a word line. Furthermore, in each stacked body 100, the uppermost electrode layer 50 is referred to as an "electrode layer 50a", and the lowermost electrode layer 50 is referred to as an "electrode layer 50b".

As illustrated in FIG. 1, individual stacked bodies 100 are arranged side by side in the Y-direction on the source layer 30. An insulating layer 60 is provided between adjacent stacked bodies 100. The columnar portions CL include a semiconductor layer 70, and the semiconductor layer 70 is electrically connected to a bit line BL through an overlying contact plug Cb. Moreover, the semiconductor layer 70 is electrically connected to the source layer 30 (FIG. 2A).

Next, a structure of the memory cell portion MCP is described in detail with reference to FIGS. 2A and 2B. FIG. 2A is a schematic sectional view taken in the Y-Z plane of the memory cell portion MCP. FIG. 2B is a schematic sectional view illustrating a portion of a memory cell MC indicated by a dashed line portion illustrated in FIG. 2A.

FIG. 2A shows only a small number of individual electrode layers 50, smaller in number than those of FIG. 1, for ease of understanding.

As illustrated in FIG. 2A, the source line 20 is provided on the insulating layer 10, and the source layer 30 is provided on the source line 20. The source line 20 is in contact with the insulating layer 10, and includes therein a high melting point metal, such as tungsten or tantalum. Moreover, the source line 20 can be, for example, a metal compound, such as tungsten nitride (WN) or tungsten silicide (WSi). Furthermore, the position of the source line 20 is not specifically limited, and can be on the source layer 30 rather than on the insulating layer 10.

The source layer 30 is, for example, an N-type semiconductor layer, and includes a first portion 31 and a second portion 33. The first portion 31 is located between the source line 20 and the second portion 33. The first portion 31 is, for example, a doped crystallized silicon layer with an impurity concentration of $1e18/cm^3$ to $1e21/cm^3$. The second portion 33 is, for example, a doped crystallized silicon layer with an impurity concentration of $1e15/cm^3$ to $1e19/cm^3$, which contains a lower concentration of N-type impurities than those in the first portion 31. Furthermore, the crystallized silicon layer is one of a single crystal structure, or polysilicon having a large crystal grain size, and the same also applies to the following description.

Furthermore, the source layer 30 is in not limited to the above example. The source layer 30 can be, for example, one or more semiconductor layers that have the same, uniform, N-type impurity concentration. The source layer 30 can be, for example, a P-type semiconductor layer. In that case, the second portion 33 contains P-type impurities lower in concentration than those in the first portion 31.

As illustrated in FIG. 2A, the columnar portion CL extends in the Z-direction, and penetrates through the stack of insulating layers 40 and electrode layers 50. An insulating layer 60 is provided between adjacent stacked bodies 100. Furthermore, an electrode layer 65, which serves as a contact plug to the source layer 30, can be provided inside the insulating layer 60.

The columnar portions CL include a semiconductor layer 70, a core 75, and an insulating layer 80. The core 75 is, for example, silicon oxide, and it extends in the Z-direction inside the columnar portion CL. The semiconductor layer 70 includes a first semiconductor layer 71 and a second semiconductor layer 73, and these each extend in the Z-direction. The semiconductor layer 70 is, for example, a crystalline silicon layer formed by crystallizing amorphous silicon, and it surrounds the core 75. The insulating layer 80 surrounds the outer perimeter of the semiconductor layer 70. In other words, the semiconductor layer 70 is located between the core 75 and the insulating layer 80. The first semiconductor layer 71 is in contact with the insulating layer 80, and the second semiconductor layer 73 is in contact with the core 75.

As illustrated in FIG. 2A, where the columnar portion CL penetrates through the electrode layer 50b which is the lowermost electrode layer in a plurality of electrode layers included in the stacked body 100, a source-side selection transistor STS is formed. The semiconductor layer 70 serves as the channel, and the electrode layer 50b serves as the source-side selection gate, of the selection transistor STS. The portion of the insulating layer 80 located between the electrode layer 50b and the semiconductor layer 70 serves as a gate insulating layer of the selection transistor STS.

A drain-side selection transistor STD is formed where the columnar portion CL penetrates through the electrode layer 50a (referring to FIG. 1), which is the uppermost electrode layer in the plurality of electrode layers 50. The electrode layer 50a serves as a drain-side selection gate of the drain-side selection transistor STD. A plurality of memory cells MC are provided by the electrode layers 50 located between the electrode layer 50a and the electrode layer 50b of each stacked body 100. The insulating layer 80, which is in contact with the electrode layers 50, serves as a gate insulating layer of each memory cell MC, and the semiconductor layer 70 serves as a channel for each memory cell MC.

As illustrated in FIG. 2B, the insulating layer 80 is formed as a multi-layered structure, including, for example, a first layer 81, a second layer 83, and a third layer 85. Each of the first layer 81, the second layer 83, and the third layer 85 extend in the Z-direction alongside, and around, the semiconductor layer 70. The second layer 83 is located between the first layer 81 and the third layer 85. The first layer 81 is located between the stack of electrode layers 50 and insulating layers 40 and the second layer 83. The third layer 85 is located between the semiconductor layer 70 and the second layer 83. Each of the first layer 81 and the third layer 85 is, for example, a silicon oxide layer, and the second layer 83 is, for example, a silicon nitride layer.

The insulating layer 80 provides a charge storage layer at the portions thereof located between the electrode layers 50 and the semiconductor layer 70. For example, electric charge is injected from the semiconductor layer 70 to the insulating layer 80 by a bias applied between the electrode layer 50 and the semiconductor layer 70. Then, the injected electric charge is trapped in the second layer 83. Moreover, the electric charge trapped in the second layer 83 is released to the semiconductor layer 70 if a reverse bias is applied between the electrode layer 50 and the semiconductor layer 70. With this structure and voltage application, data writing to a memory cell MC, and data erasure from the memory cell MC, are carried out. Furthermore, in addition to the above example, the insulating layer 80 can contain a conductive body, which serves as a floating gate, at a portion thereof located between the electrode layer 50 and the semiconductor layer 70.

In the present embodiment, the amorphous silicon initially comprising each of the source layer 30 and the semiconductor layer 70 is crystallized by a metal induced lateral crystallization (MILC) method. Although details are described below, the MILC method is a method of forming polysilicon having a large crystal grain size or a single crystal by performing annealing of amorphous silicon using a metal catalyst. Hereinafter, in the present specification, it is considered that a single crystal is formed of each of the source layer 30 and the semiconductor layer 70 by crystallization. However, it is also possible that polysilicon having a large crystal grain size is formed.

By crystallizing the source layer 30 and the semiconductor layer 70, the resistances of the source layer 30 and the semiconductor layer 70 are decreased. As a result, an issue where an increase in the channel length when the number of stacked electrode layers 50 is increased in the three-dimensionally arrayed memory cells results in increased resistance which lowers the reading and writing speeds of the memory cells MC can be avoided.

A method for manufacturing the semiconductor device 1 according to the present embodiment is now described.

Hereinafter, the method for manufacturing the semiconductor device 1 according to the present embodiment is described with reference to FIGS. 3A and 3B to FIGS. 9A and 9B.

Figure 3A:
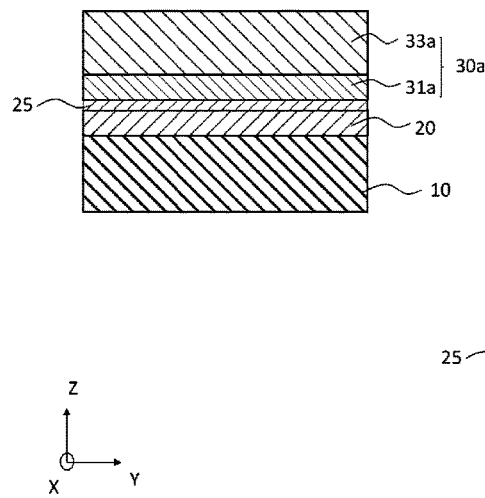
FIGS. 3A and 3B are diagrams illustrating the result of performing a step of a method for manufacturing the semiconductor device according to the first embodiment.

As illustrated in FIG. 3A, the source line 20 which includes a metal such as tungsten is formed on the insulating layer 10, and a metal layer 25 is formed on the source line 20. The insulating layer 10 is, for example, a silicon oxide layer formed using tetraethyl orthosilicate (TEOS)-chemical vapor deposition (CVD). The metal layer 25 includes, for example, at least one of nickel, cobalt, palladium, gold, and copper.

Next, the non crystallized source layer 30a is formed. Herein, the use of the sub notation of a, for example 31a, 33a, denote that the silicon is in the amorphous state and has not yet been crystallized. The source layer includes a first source sub-layer 31a and a second source sub-layer 33a. The first source sub-layer 31a is, for example, an amorphous silicon layer formed using CVD. Ions of phosphorus (P), which is an N-type impurity, are implanted into the upper surface of the first source sub-layer 31a, so that phosphorus, which is an N-type impurity, is doped thereinto. The second source sub-layer 33a is located on the upper surface side of the first source sub-layer 31a, and contains N-type impurities lower in concentration than those of the first source sub-layer 31a. Furthermore, the doping method for doping the second source sub-layer 33a with N-type impurities is not specifically limited to ion implanting.

Figure 3B:
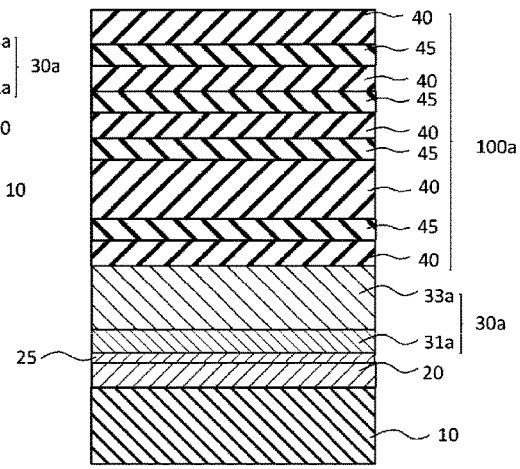

As illustrated in FIG. 3B, a stacked body 100a is formed on the source layer 30a. The stacked body 100a includes, for example, a plurality of insulating layers 40 and 45 that are alternately stacked one over the other in the Z-direction. The insulating layers 40 are, for example, silicon oxide layers formed using CVD (chemical vapor deposition). The insulating layers 45 are, for example, silicon nitride layers formed using CVD. The insulating layers 45 are formed from a material that can be selectively removed with respect to the insulating layers 40 according to a predetermined etching condition, i.e., they may be selectively etched away without significant etching or degrading of the insulating layer 40 during the etching.

Figure 4A:
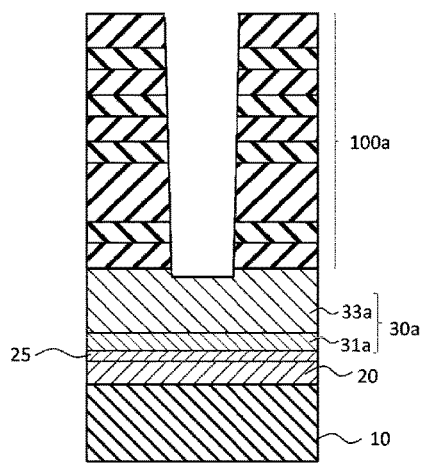
FIGS. 4A, 4B, and 4C are diagrams illustrating the result of performing a further step of method for manufacturing the semiconductor device according to the first embodiment.

As illustrated in FIG. 4A, a hole MH is formed which extends from the upper surface of the stacked body 100a to the source layer 30a. The hole MH is formed by selectively removing portions of the plurality of insulating layers 40 and 45 in the shape of the hole MH using, for example, reactive ion etching (RIE). During the etching, the etching conditions are selected such that the etching rate of the source layer 30a below the stack of insulating layers 40, 45 is lower than the etching rate of the insulating layers 40 and 45. Thus, the source layer 30a functions as an etch stop layer and the hole terminates on or slightly inwardly of the source layer 30a.

Figures 4B, 4C:
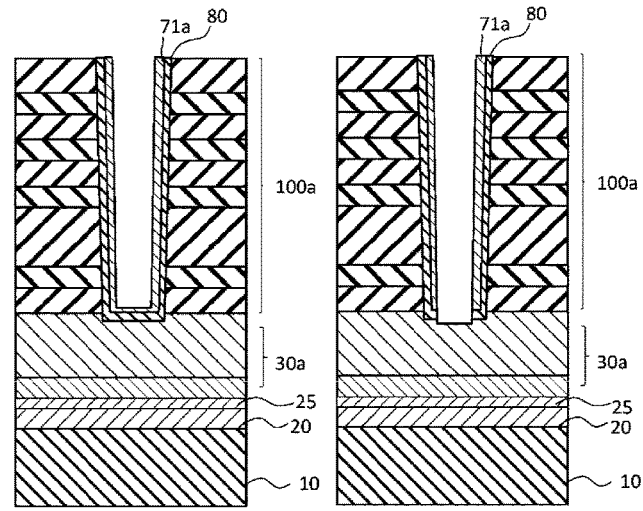

As illustrated in FIG. 4B, after the hole MH is formed, an insulating layer 80 and a first semiconductor layer 71a are formed in that sequence on the exposed surfaces of the hole MH. The insulating layer 80 is formed on the exposed surface of the hole MH using, for example, CVD. The insulating layer 80 has a structure in which a silicon oxide layer, a silicon nitride layer, and a silicon oxide layer are sequentially formed in this order. The first semiconductor layer 71a is, for example, an amorphous silicon layer, and is formed on the insulating layer 80 using CVD. The first semiconductor layer 71a is formed having a thickness allowing space (referring to FIG. 2A) for forming a second semiconductor layer 73a and the core 75 inside the hole MH.

As illustrated in FIG. 4C, the portion of the first semiconductor layer 71a and the portion of the insulating layer 80 which were formed on the bottom surface of the hole MH have been removed to expose the underlying source layer 30a at the base of the hole MH (bottom surface). These portions of the first semiconductor layer 71a and portion of the insulating layer 80 are removed using, for example, anisotropic RIE.

Figure 5A:
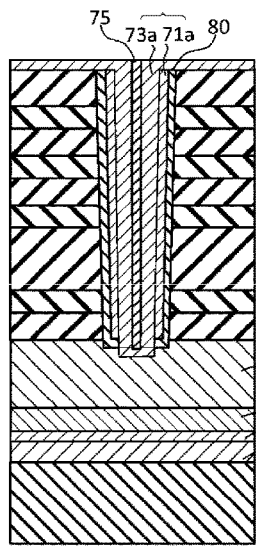
FIGS. 5A, 5B, and 5C are diagrams illustrating the result of performing a yet another step of method for manufacturing the semiconductor device according to the first embodiment.
Figure 5B:
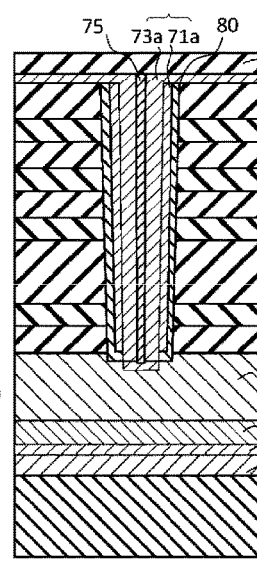
Figure 5C:
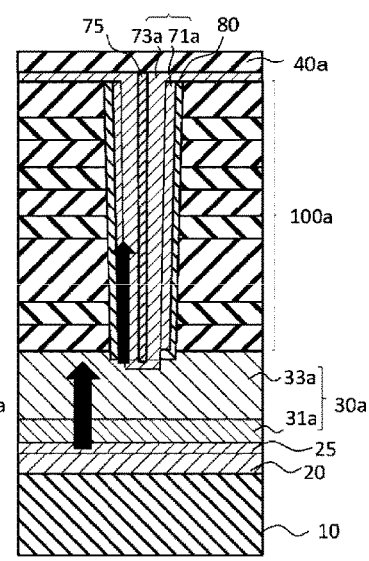

As illustrated in FIG. 5A, the second semiconductor layer 73a is formed, and it covers the first semiconductor layer 71a and the exposed portions of the insulating layer 80 and source layer 30a at the base of the hole MH. The second semiconductor layer 73a is, for example, an amorphous silicon layer, and is formed using CVD. The second semiconductor layer 73a covers the first semiconductor layer 71a formed on the inner wall of the hole MH, and is electrically connected to the source layer 30a at the bottom surface of the hole MH. The core 75 infills the gap inside of the hole MH surrounded by the second semiconductor layer 73. The core 75 includes, for example, silicon oxide formed using CVD. In the above-described way, the hole MH is formed and filled. Herein, the first semiconductor layer 71a and the second semiconductor layer 73a are collectively referred to as a "semiconductor layer 70a".

Next, an insulating film 40a composed of, for example, a silicon oxide, is formed on the upper surface of the filled hole MH and the top surface of the stacked body 100a (FIG. 5B) to form a capping layer.

The resulting structure is annealed at, for example, 500° C. to 750° C. This initiates and progresses MILC crystallization of the amorphous silicon layers of the source layer 30a and the semiconductor layer 70a as illustrated by the solid arrows in FIG. 5C, using the metal of the metal layer 25 as a catalyst. As the metal of the metal layer 25 diffuses into and through the source layer 30a and the semiconductor layer 70a, the Si—Si bonds of the amorphous silicon of the source layer 30a and the semiconductor layer 70a are subjected to surface rearrangement, so that a region of the amorphous silicon through which the metal has passed becomes crystallized. Furthermore, since the metal of the metal layer does not diffuse to the metal source line, the diffusion of the metal progresses from the lowermost amorphous silicon layer toward the uppermost amorphous layer, in the Z-direction. In other words, crystallization of the first portion 31a occurs first, and then, crystallization of the second portion 33a occurs. As a result, the first portion 31a becomes a crystallized silicon layer (first sub-layer 31) changed from an amorphous silicon layer, and the second portion 33a becomes a crystallized silicon layer (second sub-layer 31) changed from an amorphous silicon layer. Furthermore, in each of these crystallized silicon layers, a single crystal of silicon, or polysilicon having a large crystal grain size, is formed as a result of crystallization.

As the upward diffusion of the metal of the metal layer 25 progresses, the semiconductor layer 70a is next crystallized. The semiconductor layer 70a is crystallized with the crystal orientation thereof aligned with that of the source layer 30a having had the amorphous silicon layer thereof crystallized. Thus, the semiconductor layer 70 becomes crystallized into semiconductor layer 70.

Once crystallized, the semiconductor layer 70 may be a single crystal as mentioned above, but can be polycrystalline. In other words, in the semiconductor layer 70, each of the channels (the semiconductor layer 70) of at least two memory cells MC electrically connected to each other (for example, memory cells adjacent to the uppermost and lowermost electrode layers 50) become a single crystal. However, the memory cells are not limited to the uppermost and lowermost memory cells.

Furthermore, in the present embodiment, since the metal of the metal layer 25 diffuses from the lowermost layer to the uppermost layer in the Z-direction, the crystal grain size in the lower layer is larger and is likely to be more uniform, as compared with a case where metal is diffused from the upper side of the layers. Furthermore, the term "crystal grain size" refers to the maximum vertical dimension of the crystal grain with respect to the Z-direction. For example, the semiconductor layer 70 has a crystal grain size equal to or greater than the film thickness thereof in the z direction (the dimension between the insulating layer 80 and the core 75). Thus, in the semiconductor layer 70, the average of crystal grain sizes becomes larger in the lower layer as compared with that in the upper layer. Furthermore, the term "average of crystal grain sizes" refers to, for example, an average value of grain sizes of crystals included in a unit area on the Z-Y plane of the semiconductor layer 70. Moreover, the unit area is set to an area including at least a plurality of crystals.

Figure 6A:
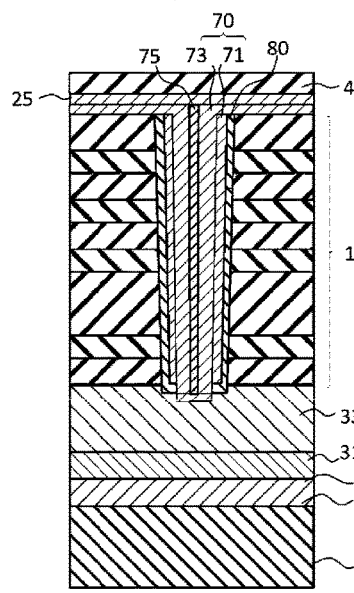
FIGS. 6A and 6B are diagrams illustrating the result of further steps in the method for manufacturing the semiconductor device according to the first embodiment.

When annealing is further continued at 500° C. to 750° C., the metal from the metal which has diffused through the silicon layers segregates from the semiconductor layer 70 and accumulates in between the top-surface insulating film 40a and the stacked body 100a as illustrated in FIG. 6A. More specifically, the metal segregates from the semiconductor layer 70 at the boundary between the second semiconductor layer 73 and the insulating film 40a as shown by reference numeral 25 in FIG. 6A.

Figure 6B:
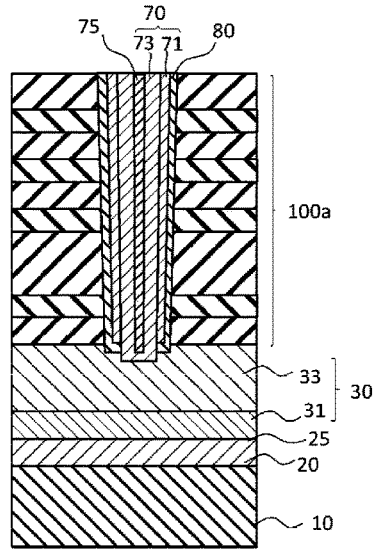

Next, as illustrated in FIG. 6B, the insulating film 40a and the segregated metal are removed by, for example, chemical mechanical polishing (CMP) or dry etching. Furthermore, impurities may be injected into the crystallized silicon in the upper portion of the hole MH.

Figure 7A:
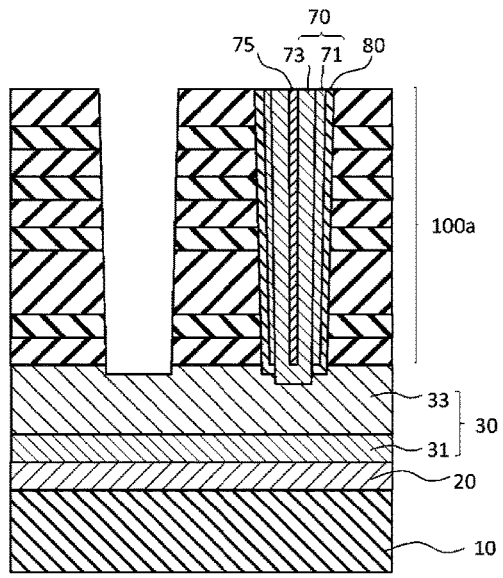
FIGS. 7A and 7B are diagrams illustrating the result of further steps in the method for manufacturing the semiconductor device according to the first embodiment.

As illustrated in FIG. 7A, a trench ST is formed into the stacked body 100a, which divides the stacked body 100a into a plurality of individual stacked body 100 portions. The trench ST is formed so as to have a depth extending from the upper surface of the stacked body 100a to the source layer 30a using, for example, anisotropic RIE. The trench ST extends in the X-direction, and divides the stacked body 100a into a plurality of portions each of which serves as an individual stacked body 100.

Figure 7B:
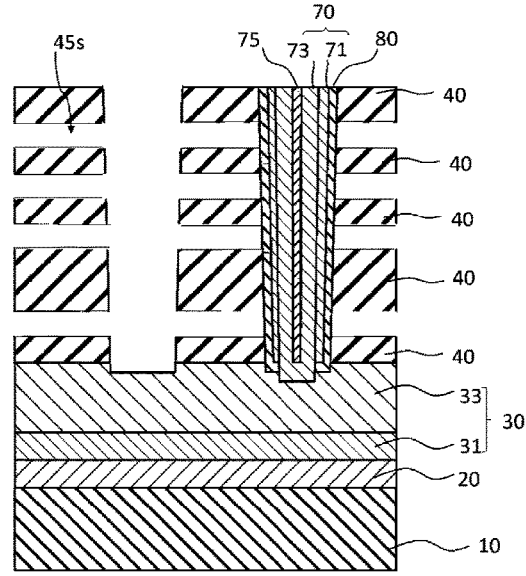

As illustrated in FIG. 7B, the insulating layers 45 are selectively removed. The insulating layers 45 are selectively subjected to etching, for example, by an etchant supplied thereto through the trench ST. In a case where the insulating layer 45 is a silicon nitride layer and the insulating layer 40 is a silicon oxide layer, using thermal phosphoric acid as an etchant enables selectively removing the insulating layers 45 while leaving the insulating layers 40 substantially un-etched. Furthermore, the source layer 30 is formed of a material that is resistant to the etchant for the insulating layers 45.

Figure 8A:
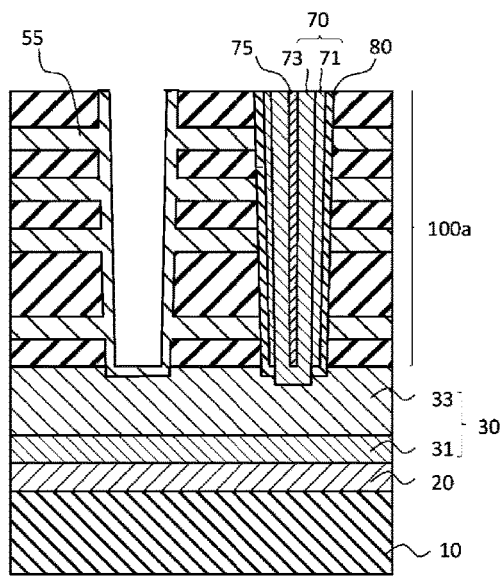
FIGS. 8A and 8B are diagrams illustrating the result of further steps in the method for manufacturing the semiconductor device according to the first embodiment.

As illustrated in FIG. 8A, metal layers 55 are formed in the spaces 45s which were formed by removing the insulating layers 45 by the etchant. The metal layer 55 is, for example, a tungsten layer formed using CVD. A source gas for CVD is supplied to the spaces 45s through the trench ST.

Figure 8B:
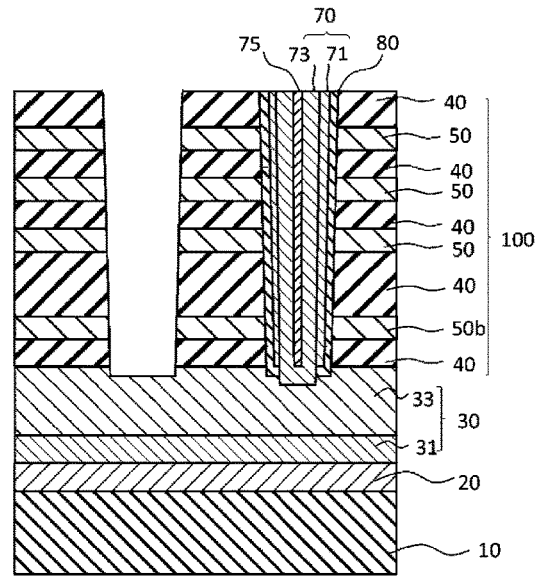

As illustrated in FIG. 8B, the portions of the metal layer 55 formed on the inner surface of the trench ST are removed, to form individual electrode layers 50. With this, a stacked body 100 including a plurality of electrode layers 50 (referring to FIG. 1) is completed. The adjacent electrode layers 50 in the Z-direction are electrically insulated from each other by the insulating layer 40.

Figure 9A:
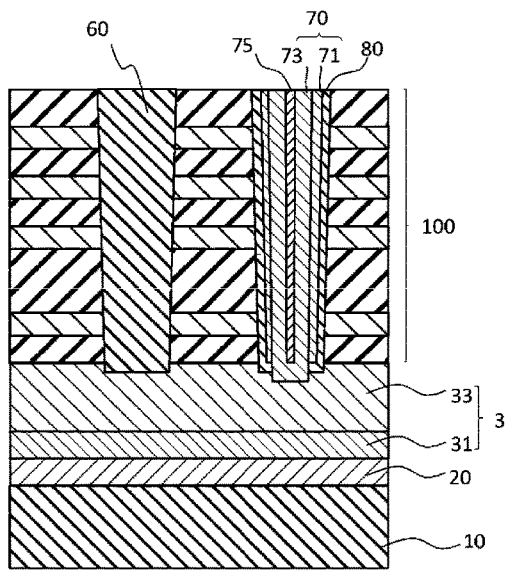
FIGS. 9A and 9B are diagrams illustrating the result of further steps in the method for manufacturing the semiconductor device according to the first embodiment.

As illustrated in FIG. 9A, the insulating layer 60 is then formed in the trench ST. The insulating layer 60 is, for example, a silicon oxide layer formed using CVD, and it electrically insulates adjacent stacked bodies 100 from each other (referring to FIG. 1). The bit lines BL are then formed over the stacked body 100 on an interlayer insulating layer (not illustrated), thus completing the memory cell portion MCP. Furthermore, as illustrated in FIG. 2A, an electrode layer 65 may be formed, which includes, for example, a tungsten layer which is used as a contact plug, inside the insulating layer 60.

In the above-described way, the memory cell portion MCP of the semiconductor device 1 according to the present embodiment is completed.

In the above-described method for formation, a metal layer 25 is formed prior to the forming of the stacked body 100, annealing is performed to cause the metal of the metal layer 25 to migrate into the amorphous silicon layers thereover in the Z-direction, and crystallization of the amorphous silicon source layer 30a and semiconductor layer 70 is performed using the metal as a catalyst, such that a source layer 30 and a semiconductor layer 70, each of which is a crystallized silicon layer composed of a single crystal or polysilicon having a large crystal grain size, can be formed. Crystallizing the silicon layer decreases the resistance of the silicon layer, and hence of the channel. Accordingly, in a case where a large number of electrode layers are stacked in layers in, for example, a three-dimensional array semiconductor device, increased resistance and resulting lower reading and writing speeds of the memory cells can be avoided.

Moreover, since the metal layer 25 is formed prior to forming the layers of the source and semiconductor layer 70a, for example, between the source layer 30a and the source line 20, and not on the upper layer of the semiconductor device, the metal of the metal layer 25 migrates in the direction of the layers thereover and eventually segregates from the semiconductor layer 70 at the interface thereof with the insulating layer 40 located at the uppermost surface (the uppermost layer) of the structure. When the insulating layer 40 is removed, the metal layer is removed, and no metal remains in the source layer and the semiconductor layer as compared with a case where the metal layer is formed at the upper layer of the semiconductor device and migrated therefrom inwardly of the structure in the direction of the source layer 30. Accordingly, the possibility that metal remains in the semiconductor layer to cause the deterioration of cell transistor characteristics, such as unevenness of parasitic resistances of memory cells, increase of power during power-off, and degradation of reliability of a tunnel film caused by metal diffusion in the subsequent process, can be reduced.

Figure 9B:
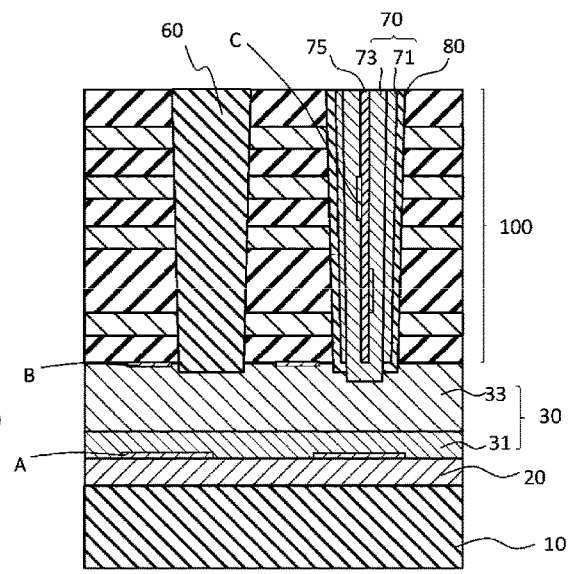

Furthermore, in the semiconductor device according to the present embodiment, as illustrated in FIG. 9B, portions of the metal layer 25 may remain where its presence does not cause concern about the above-mentioned deterioration of transistor characteristics, for example in one or more locations of between the source line 20 and the source layer 30 (A), an $SiO_2/Si$ interface, such as between the second portion 33 of the source layer 30 and the insulating layer 40 (B), and inside the hole MH (C). In this case, the concentration of the remaining metal at the lower levels of the structure is higher than at the upper level in the Z-direction.

Hereinafter, a modification example of the method for manufacturing the semiconductor device according to the first embodiment is described with reference to FIGS. 10A and 10B.

The method for manufacturing the semiconductor device according to the modification example differs from that of the first embodiment in the location of the metal layer before annealing.

Figure 10A:
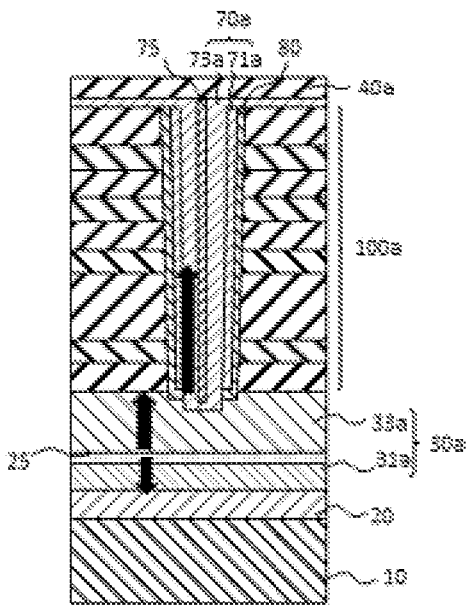
FIGS. 10A and 10B are diagrams illustrating the result of a step of the method for manufacturing a semiconductor device according to a modification example.

As illustrated in FIG. 10A, the metal layer 25 is provided, for example, between the first sub-layer 31a and the second sub-layer 33a of the source layer 30a. In this case, during annealing the metal of the metal layer 25 migrates into the layers thereover and thereunder in the Z-direction, and the first sublayers 31a, second sub-layers 33a and the semiconductor layer 70a are crystallized. Furthermore, the temperature and other conditions during annealing are similar to those in the first embodiment.

Figure 10B:
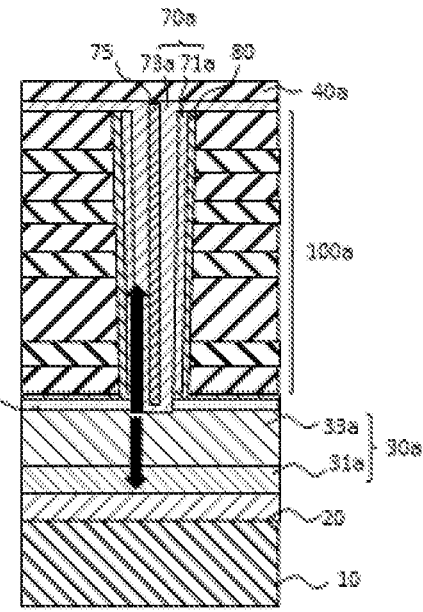

On the other hand, as illustrated in FIG. 10B, the metal layer 25 can be formed between the source layer 30a and the lowermost insulating layer 40 of the stacked body. In this case, during annealing the metal of the metal layer 25 migrates in the + and –X directions, and the source layer 30a and the semiconductor layer 70a are crystallized.

In the above-described way, the position of formation of the metal layer 25 can be varied. In all cases, the possibility that the metal remains especially in the semiconductor layer can be reduced.

Furthermore, except the position in which to form the metal layer 25, the method for formation and the advantages in the modification example are similar to those of the first embodiment.

(Second Embodiment)

Hereinafter, a second embodiment is described with reference to FIG. 11 to FIGS. 13A and 13B.

The semiconductor device 1 according to the second embodiment differs from that of the first embodiment in that a third semiconductor layer 90 is provided in a lower region of the hole MH. In other words, the third semiconductor layer 90 is provided between the semiconductor layer 70 and the source layer 30. Elements of the structure similar to those of the first embodiment are omitted from the following description, where appropriate.

Figure 11:
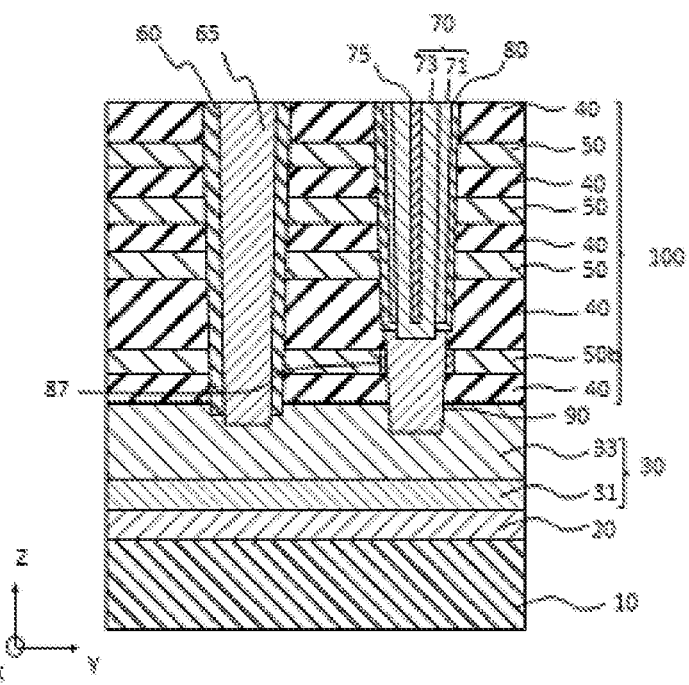
FIG. 11 is a cross-sectional view illustrating the memory cell portion of the semiconductor device according to the second embodiment.

FIG. 11 is a schematic sectional view illustrating the memory cell portion MCP of the semiconductor device 1 according to the second embodiment. As illustrated in FIG. 11, the memory cell portion MCP in the present embodiment includes the crystallized third semiconductor layer 90 in the lower portion of the hole MH. The third semiconductor layer 90 is, for example, a single crystal, but can be polycrystalline. The third semiconductor layer 90 is formed so as to, for example, contact the source layer 30 in the Z-direction and extend across electrode layer 50b. Insulating layer 87 is provided between the third semiconductor layer 90 and the electrode 50b. Furthermore, the other structures are similar to those of the first embodiment.

The third semiconductor layer 90 is, for example, a crystallized silicon layer, and contains, for example, the same impurities as those in the source layer 30. The impurity concentration of the third semiconductor layer 90 is not specifically limited. Insulating layer 87 is, for example, silicon oxide. A transistor is formed in electrode layer 50 through which the third semiconductor layer 90 is formed (for example, the electrode layer 50b).

In the present embodiment, crystallized silicon layer, i.e., the third semiconductor layer 90, is formed in the lower portion of the hole MH, so that electric current flows easily to the source layer 30 and the source line 20.

Next, a method for manufacturing the semiconductor device 1 according to the present embodiment is described with reference to FIGS. 12A, 12B, and 12C and FIGS. 13A and 13B.

First, a stacked body 100a is formed on the source layer 30a, and then a hole MH is formed by, for example, etching (referring to FIG. 3B and FIG. 4A).

As illustrated in FIG. 12A, a third semiconductor layer 90a is formed inside the hole MH. At this time, the third semiconductor layer 90a is, for example, an amorphous silicon layer.

Next, as illustrated in FIG. 12B, the third semiconductor layer 90a is removed, except for the portion thereof located in the lower portion of the hole MH and across lower electrode layer 50b using, for example, RIE.

As illustrated in FIG. 12C, an insulating layer 80, a semiconductor layer 70a, and a core 75 are formed on the third semiconductor layer 90a in the hole MH in a manner similar to that in the first embodiment, and then an insulating film 40a is formed on the uppermost surface (referring to FIG. 4B to FIG. 5B).

Next, as illustrated in FIG. 13A, annealing is performed at, for example, 500° C. to 750° C. The annealing causes the metal layer 25 to move toward the upper layer side of the structure in the Z-direction and to crystallize the amorphous silicon layer, with the metal used as a catalyst. Accordingly, the source layer 30a, the third semiconductor layer 90a, and the semiconductor layer 70a are crystallized in this order, and each of the crystalline source layer 30, the third semiconductor layer 90, and the semiconductor layer 70 are formed. The crystallized silicon layer becomes a single crystal or polysilicon having a large crystal grain size.

When annealing is further continued at the above-mentioned temperature, as illustrated in FIG. 13B, the metal layer 25 segregates, and accumulates at the boundary between the top-surface insulating film 40a and the stacked body 100a. The metal layer 25 is removed by, for example, dry etching or polishing in a similar way to that of the first embodiment, and, finally, a trench ST is formed, insulating layer 87 is formed by oxidation of the third semiconductor layer 90, and ST filled, to complete the semiconductor device 1 according to the present embodiment.

In the semiconductor device according to the present embodiment, which has advantages similar to those of the first embodiment, since a semiconductor layer is provided in a lower portion of the hole, an insulating layer (a charge storage layer) does not need to be provided in the hole that is in contact with the lower electrode layers of the stacked body. Therefore, the electric current flows easily to the source layer 30 and the source line 20, and a semiconductor device more improved in reliability can be manufactured.

Furthermore, the modification example described in the first embodiment can also be applied to the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first layer;
   a first semiconductor layer on the first layer;
   a stacked body on the first semiconductor layer, the stacked body including a plurality of electrode layers spaced apart in a first direction;
   a first insulating layer extending inwardly of the stacked body in the first direction and extending past at least a portion of the electrode layers; and
   a second semiconductor layer electrically connected to the first semiconductor layer and extending inwardly of the stacked body in the first direction, wherein the first insulating layer extends between the second semiconductor layer and adjacent electrode layers in the stacked body, wherein
   a plurality of memory cells are located at the interface of the individual electrode layers with the adjacent portions of the first insulating layer and the second semiconductor layer, the plurality of memory cells including a first memory cell and a second memory cell farther from the first layer than the second memory cell;
   a first portion of the second semiconductor layer that is adjacent the first memory cell includes a single crystal and a second portion of the second semiconductor layer that is adjacent the second memory cell includes a single crystal; and
   an average crystal grain size in the first portion of the second semiconductor layer is larger than in the second portion of the second semiconductor layer.

2. The semiconductor device according to claim 1, wherein the first insulating layer comprises a plurality of layers.

3. The semiconductor device according to claim 1, wherein the first insulating layer is configured to store a charge in a plurality of sections positioned between the plurality of electrode layers and the first semiconductor layer.

4. The semiconductor device according to claim 1, wherein the first layer and the stacked body are organized parallel in a second direction, wherein the second direction is approximately orthogonal to the first direction.

5. The semiconductor device according to claim 1, wherein the first semiconductor layer is monocrystalline.

6. The semiconductor device according to claim 1, wherein the first semiconductor layer comprises a plurality of layers.

7. A semiconductor device comprising:
   a conductive layer including a first metal layer;
   a stacked body on the conductive layer, the stacked body including a plurality of electrode layers spaced apart in a first direction;
   a first insulating layer extending inwardly of the stacked body in the first direction and extending past at least a portion of the electrode layers; and
   a first semiconductor layer electrically connected to the conductive layer and extending inwardly of the stacked body in the first direction, wherein the first insulating layer extends between the first semiconductor layer and adjacent electrode layers in the stacked body, wherein the conductive layer includes a metal different from the metal of the first metal layer.

8. The semiconductor device according to claim 7, wherein the conductive layer includes a second semiconductor layer provided on the first metal layer.

9. The semiconductor device according to claim 8, wherein at least one surface of the first semiconductor layer and the second semiconductor layer includes a metal different than the metal of the first metal layer.

10. The semiconductor device according to claim 9, wherein a concentration of the metal is greater at a surface of the first or second semiconductor layers closer to the first conductive layer than at a surface of the first or second semiconductor layers farther from the first conductive layer.

11. The semiconductor device according to claim 7, wherein the metal comprises at least one of nickel, cobalt, palladium, gold, and copper.

12. The semiconductor device according to claim 7, further comprising a third semiconductor layer located between the conductive layer and the first semiconductor layer, the third semiconductor layer electrically connected to the conductive layer and the first semiconductor layer.

13. The semiconductor device of claim 12, further comprising a second insulating layer disposed between the third semiconductor layer and an electrode layer of the plurality of electrode layers.

14. The semiconductor device of claim 12, wherein the first insulating layer is disposed between the second semiconductor layer and the third semiconductor layer.

15. The semiconductor device according to claim 7, further comprising a source-side selection transistor, wherein the source-side selection transistor comprises an electrode layer, of the stacked body, nearest to the conductive layer.

16. The semiconductor device according to claim 7, further comprising a drain-side selection transistor, wherein the drain-side selection transistor comprises an electrode layer, of the stacked body, farthest from the conductive layer.

17. The semiconductor device according to claim 7, wherein the first insulating layer comprises a conductive body.

18. The semiconductor device according to claim 7, further comprising a second stacked body over the conductive layer.

19. The semiconductor device according to claim 18, wherein a second insulating layer is disposed between the stacked body and the second stacked body.

20. The semiconductor device according to claim 19, further comprising an electrode disposed between the stacked body and the second stacked body, the electrode electrically coupled to the conductive layer, wherein the second insulating layer is disposed between the electrode and the stacked body, and wherein the second insulating layer is further disposed between the electrode and second stacked body.

* * * * *